US012805377B2

(12) United States Patent
Schuderer et al.

(10) Patent No.: US 12,805,377 B2
(45) Date of Patent: Nov. 17, 2026

(54) POWER SEMICONDUCTOR MODULE WITH ACCESSIBLE METAL CLIPS

(71) Applicant: Hitachi Energy Ltd, Zürich (CH)

(72) Inventors: Juergen Schuderer, Zürich (CH); Niko Pavlicek, Zürich (CH); Chunlei Liu, Oberrohdorf (CH); Arne Schroeder, Bern (CH); Gerd Schlottig, Uitikon Waldegg (CH)

(73) Assignee: Hitachi Energy Ltd., Zürich (CH)

( * ) Notice: Subject to any disclaimer, the term of this patent is extended or adjusted under 35 U.S.C. 154(b) by 585 days.

(21) Appl. No.: 17/795,951

(22) PCT Filed: Jan. 27, 2021

(86) PCT No.: PCT/EP2021/051868

§ 371 (c)(1),
(2) Date: Jul. 28, 2022

(87) PCT Pub. No.: WO2021/151949

PCT Pub. Date: Aug. 5, 2021

(65) Prior Publication Data

US 2023/0048878 A1 Feb. 16, 2023

(30) Foreign Application Priority Data

Jan. 30, 2020 (EP) .................................... 20154509

(51) Int. Cl.
*H10W 74/10* (2026.01)
*G01R 33/09* (2006.01)
(Continued)

(52) U.S. Cl.
CPC ........ *H10W 74/124* (2026.01); *G01R 33/091* (2013.01); *H10W 40/475* (2026.01);
(Continued)

(58) Field of Classification Search
CPC ............... H01L 23/315; H01L 23/3135; H01L 23/3142; H01L 23/4735; H01L 23/49844;
(Continued)

(56) References Cited

U.S. PATENT DOCUMENTS

| | | | | |
|---|---|---|---|---|
| 9,255,950 | B2 | 2/2016 | Zink | |
| 10,699,976 | B1 * | 6/2020 | Hoegerl | H01L 23/3121 |

(Continued)

FOREIGN PATENT DOCUMENTS

| | | | |
|---|---|---|---|
| CN | 103996663 | A | 8/2014 |
| CN | 104810330 | A | 7/2015 |

(Continued)

OTHER PUBLICATIONS

Espacenet translation of DE 202016006849 (Year: 2016).*
(Continued)

*Primary Examiner* — Zandra V Smith
*Assistant Examiner* — Corbyn D Mellinger
(74) *Attorney, Agent, or Firm* — Slater Matsil, LLP

(57) ABSTRACT

A power semiconductor module includes a substrate with a metallization layer that is structured. A semiconductor chip having a first side bonded to the metallization layer. A metal clip, which is a strip of metal, has a first planar part bonded to a second side of the semiconductor chip opposite to the first side. The metal clip also has a second planar part bonded to the metallization layer. A mold encapsulation at least partially encloses the substrate and the metal clip. The mold encapsulation has a recess approaching towards the first planar part of the metal clip. The semiconductor chip is completely enclosed by the mold encapsulation, the substrate and the metal clip and the first planar part of the metal clip is at least partially exposed by the recess. A sensor is accommodated in the recess.

20 Claims, 3 Drawing Sheets

(51) Int. Cl.

| | |
|---|---|
| ***H10W 40/47*** | (2026.01) |
| ***H10W 70/65*** | (2026.01) |
| ***H10W 90/00*** | (2026.01) |
| *H10W 70/40* | (2026.01) |
| *H10W 72/00* | (2026.01) |
| *H10W 72/60* | (2026.01) |

(52) U.S. Cl.

CPC ....... *H10W 70/658* (2026.01); *H10W 74/121* (2026.01); *H10W 74/127* (2026.01); *H10W 90/00* (2026.01); *H05K 2201/10015* (2013.01); *H05K 2201/10151* (2013.01); *H05K 2201/10166* (2013.01); *H05K 2201/10318* (2013.01); *H10W 70/479* (2026.01); *H10W 72/07653* (2026.01); *H10W 72/631* (2026.01); *H10W 90/764* (2026.01)

(58) Field of Classification Search

CPC ..... H01L 24/40; H01L 25/162; H01L 25/165; H01L 23/49861; H01L 2224/4007; H01L 2224/40091; H01L 2224/40225; H01L 2924/13055; H01L 2924/13091; H01L 2924/19041; H01L 2924/19043; H01L 2924/30101; H01L 23/16; H01L 23/36; H01L 23/3735; H01L 23/3121; H01L 23/49811; H01L 23/564; H01L 24/01; H01L 24/37; H01L 24/84; H01L 2224/0603; H01L 2224/06181; H01L 2224/32225; H01L 2224/73263; H01L 2224/83801; H01L 2224/8384; H01L 2224/8385; H01L 2924/10253; H01L 2924/10272; H01L 2924/1301; H01L 2924/1304; H01L 24/73; H01L 2224/37644; H01L 2224/84214; H01L 2224/84801; H01L 2224/8484; H01L 2924/19105; H01L 23/473; H01L 24/72; H01L 25/072; H01L 2924/1815; G01R 33/091; H05K 2201/10015; H05K 2201/10151; H05K 2201/10166; H05K 2201/10318; H05K 1/0268; H05K 3/3436; H05K 1/0272; H05K 3/321; H05K 2201/10196; H05K 2201/10265; G01K 1/143; Y02P 70/50

See application file for complete search history.

(56) References Cited

U.S. PATENT DOCUMENTS

| | | | | |
|---|---|---|---|---|
| 2007/0132112 | A1 | 6/2007 | Ozaki et al. | |
| 2010/0019367 | A1 | 1/2010 | Letterman, Jr. et al. | |
| 2013/0126866 | A1* | 5/2013 | Hatsukawa | H01L 22/22 257/E21.526 |
| 2014/0232015 | A1 | 8/2014 | Otremba et al. | |
| 2015/0214133 | A1 | 7/2015 | Otremba et al. | |
| 2016/0043009 | A1* | 2/2016 | Beyer | H10N 10/00 257/48 |
| 2016/0163613 | A1 | 6/2016 | Uchibori et al. | |
| 2020/0273760 | A1 | 8/2020 | Fukumoto et al. | |
| 2022/0093486 | A1* | 3/2022 | Reiter | H10W 40/611 |

FOREIGN PATENT DOCUMENTS

| | | | | |
|---|---|---|---|---|
| CN | 105789157 | A | | 7/2016 |
| DE | 202016006849 | | * | 7/2016 |
| EP | 2447991 | A2 | | 5/2012 |
| EP | 3300105 | A1 | | 3/2018 |
| JP | H0714948 | A | | 1/1995 |
| JP | 2006121861 | A | | 5/2006 |
| JP | 2007049810 | A | | 2/2007 |
| JP | 2008262946 | A | | 10/2008 |
| JP | 2009194327 | A | | 8/2009 |
| JP | 2010182879 | A | | 8/2010 |
| JP | 2014123618 | | * | 7/2014 |
| JP | 2014123618 | A | | 7/2014 |
| JP | 2015029055 | A | | 2/2015 |
| JP | 2016189487 | A | | 11/2016 |
| JP | 2019082792 | A | | 5/2019 |
| WO | 0171301 | A1 | | 9/2001 |
| WO | 2018235511 | A1 | | 12/2018 |

OTHER PUBLICATIONS

Espacenet translation of JP 2014123618 (Year: 2014).*

Blackburn, David L., "Temperature Measurements of Semiconductor Devices—A Review", 20th Annual IEEE Semiconductor Thermal Measurement and Management Symposium, San Jose, CA, USA, Mar. 11, 2004, 11 pages.

Li, Chengmin, et al., "Junction Temperature Measurement Based on Electroluminescence Effect in Body Diode of SiC Power MOSFET", 2019 IEEE Applied Power Electronics Conference and Exposition, Anaheim, CA, USA, Mar. 17-21, 2019, 6 pages.

Niu, He, et al., "Evaluating Different Implementations of Online Junction Temperature Sensing for Switching Power Semiconductors", 2015 IEEE Energy Conversion Congress and Exposition (ECCE), Sep. 20-24, 2015, pp. 5696-5703.

Mollov, Dr. Stefan, et al., "Condition and Health Monitoring in Power Electronics", CIPS 2018—10th International Conference on Integrated Power Electronics Systems, Stuttgart, Germany, Mar. 20-22, 2018, 8 pages.

* cited by examiner

POWER SEMICONDUCTOR MODULE WITH ACCESSIBLE METAL CLIPS

CROSS-REFERENCE TO RELATED APPLICATIONS

This application is a national stage application of International Application No. PCT/EP2021/051868, filed on Jan. 27, 2021, which claims priority to European Patent Application No. 20154509.2, filed on Jan. 30, 2020, which applications are hereby incorporated herein by reference.

TECHNICAL FIELD

The invention relates to the field of power electronics. In particular embodiments, the invention relates to a power semiconductor module.

BACKGROUND

Condition and health monitoring are effective means of improving the availability and lifetime of power electronic components, converters and systems. The active power semiconductor components usually are the main reasons for converter failures. Therefore, a precise determination of physical conditions of power semiconductor chips packaged into a module may be beneficial for predicting failures in advance.

US 2007/0132112 A1 shows a semiconductor module with a mold encapsulation, which has a groove to apply pressure on a leadframe below a chip during molding. The leadframe is pushed down by a vertical mold flow.

EP 2 447 991 A2 shows an electronic member, which comprises a chip on a substrate, which is connected on a top side via spring elements with a contact element. The contact element, the substrate and the chip are partially enclosed in a mold material, wherein a recess above the chip comprising the spring elements is left out.

US 2015/214133 A1 shows an electronic device with a chip on a substrate, which on a top side is connected via a contact element with another part of the substrate. The substrate, chip and contact element are partially embedded in an encasing, wherein an area above the contact element is left free.

JP 2009 194327 A shows a semiconductor device with chips on a substrate, which are interconnected with a clip. The substrate, chips, and clip are enclosed in an encasing, wherein an area of the encasing above the clip has a recess.

SUMMARY

Embodiments of the invention can improve and facilitate the determination and measurement of physical conditions of power semiconductor chips packaged into a module.

In one embodiment, a power semiconductor module comprises a substrate with a metallization layer that is structured. At least one semiconductor chip is bonded to the metallization layer with a first side. A metal clip, which is a strip of metal, is bonded with a first planar part to a second side of the semiconductor chip opposite to the first side and bonded with a second planar part to the metallization layer. A mold encapsulation at least partially encloses the substrate, the at least one semiconductor chip and the metal clip. The mold encapsulation has a recess approaching towards the first planar part of the metal clip. A circuit board is attached to the mold encapsulation above the recess. The semiconductor chip, to which the metal clip is bonded, is completely enclosed by the mold encapsulation, the substrate and the metal clip. The first planar part of the metal clip is at least partially exposed by the recess sand the circuit board carries a sensor accommodated in the recess.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF ILLUSTRATIVE EMBODIMENTS

Figure 1:
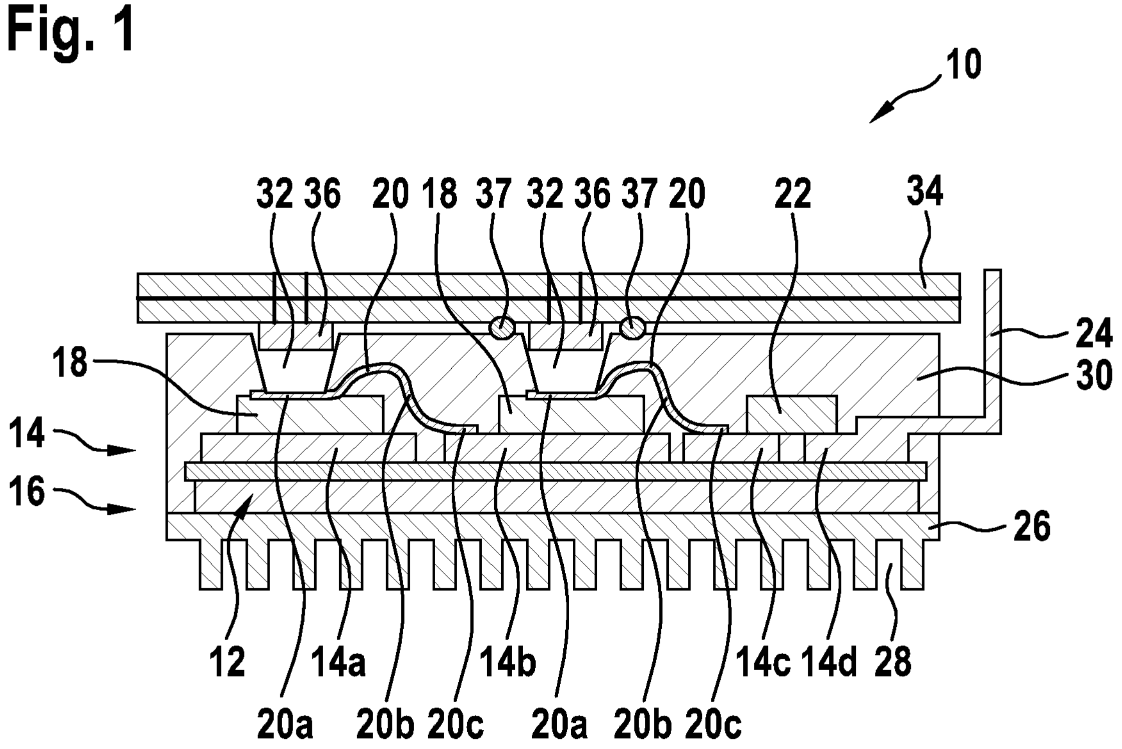
FIG. 1 schematically shows a cross-section through a power semiconductor module according to an embodiment of the invention.

Reference can now be made to the figures in general. Further description of each figure is provided below.

Embodiments of the invention relate to a power semiconductor module 10. A semiconductor module 10 may be a device mechanically and electrically interconnecting one or more semiconductor chips 18 with each other and with terminals that may be exposed by a housing of the module 10. Here and in the following, the term power may relate to the ability of the semiconductor module 10 and/or components of the semiconductor module 10 to process currents of more than 10 A and/or voltages of more than 100 V.

According to an embodiment of the invention, the power semiconductor module 10 comprises a substrate 12 with a structured metallization layer 14; at least one semiconductor chip 18 bonded to the metallization layer 14 with a first side; a metal clip 20 bonded with a first part **20*a* to a second side of the semiconductor chip 18 opposite to the first side and bonded with a second part 20*b* to the metallization layer 14; and a mold encapsulation 30 at least partially enclosing the substrate 12, the at least one semiconductor chip 18 and the metal clip 20. The mold encapsulation 30 has a recess 32 approaching towards the first part 20*a* of the metal clip 20. The mold encapsulation 30 may cover and/or surround the semiconductor chip 18 except for parts of the semiconductor chip 18 bonded to the metallization layer 14 and to the metal clip 20**.

The substrate 12 may be insulating and/or made of polymers and/or ceramics that may be covered on one or both sides with a metallization layer 14. The substrate 12 may also be not insulating, for example may be based on a leadframe. The metallization layer 14 may be structured, i.e. divided into several areas, which may be used for connecting and/or bonding one or more semiconductor chips 18, electrical contacts and/or terminals.

The substrate 12 also may be based on a leadframe. For example, the metallization layer 14 may be made of a leadframe. The metallization layer and/or the leadframe may also provide metal parts, which provide a terminal of the power semiconductor module 10. The second part 20*b* of the metal clip 20 may be bonded to a part of the metallization layer 14 providing a terminal of the power semiconductor module 10.

It is possible that the module 10 comprises one or more semiconductor chips 18, which may be controllable devices, such as transistors and/or thyristors. It also may be that some of the semiconductor chips 18 are diodes. The semiconductor chips 18 may be based on Si or SiC or another wide bandgap material.

The one or more semiconductor devices may be bonded with the first or bottom side to the metallization layer 14. Here and in the following, bonding may refer to soldering, sintering, gluing, welding and/or any other solid metallurgical interconnection. On the second and/or top side of the one or more chips 18, a metal clip 20 may be bonded with a first part and/or first end.

With a second part and/or second end, the metal clip 20 may be bonded to the metallization layer 14, in particular besides the semiconductor chip 18. The metal clip 20 may be a strip 50 of metal, which may be thinner in a direction orthogonal to the extension direction of the metallization layer 14 as compared to an orthogonal direction. The metal clip 20 may be provided by a leadframe. The first part and/or the second part of the metal clip 20 may be planar. A middle part of the clip 20 may be bent.

The substrate 12 with the metallization layer 14, the one or more semiconductor chips 18 and the one or more metal clips 20 may be at least partially encapsulated into a mold encapsulation 30, which may be formed by molding of a plastics material.

Above one or more semiconductor chips 18, one or more recesses may be provided in the mold encapsulation 30, which approaches towards the respective metal clip 20 above the chip 18 to which it is bonded. This may mean that the metal clip 20 is exposed or that solely a cover layer above the metal clip 20 is left.

The recess may be an opening and/or hole in the mold encapsulation 30, which runs through the material of the mold encapsulation 30 towards the metal clip 20.

Except the one or more recesses, the mold encapsulation 30 may complete enclose the one or more semiconductor chips 18 and the one or more metal clips 20 together with the substrate 12. In particular, a middle part 20*b* of the metal clip 20 and the second part 20*c* of the metal clip 20 bonded to the metallization layer 14 may be completely encapsulated into the material of the mold encapsulation 30.

The semiconductor chip 18 may be bonded with its bottom side to the metallization layer 14. All other parts of the semiconductor chip 18 not bonded to the metallization layer 14 and the metal clip 20 may be encapsulated by the mold encapsulation 30.

The recesses allow to nearly directly access the power semiconductor chips 18, while the metal clip 20 and mold encapsulation 30 protect the semiconductor chips 18 from environment conditions. The recesses may be provided for any multichip 18 power semiconductor module 10 with planar topside interconnection, provided by a clip 20 and/or leadframe. The recess, which may be seen as an access channel in the mold encapsulation 30, may expose at least a topside of the respective semiconductor chip 18 for sensing and/or mechanical contacting.

The first part 20*a* of the metal clip 20 may provide protection against mechanical influence, such as spring contacting. The footprint of the contact zone may be kept small compared to separate exposed die and pad regions that may require own keep-out zones. Furthermore, the first part 20*a* of the metal clip 20 may be used for thermal buffering under transient overloads.

According to an embodiment of the invention, the semiconductor chip 18, to which the metal clip 20 is bonded, is completely enclosed by the mold encapsulation 30, the substrate 12 and the metal clip 20. All parts of the chip 18, which are not in contact with the metallization layer 14, the metal clip 20 and other electrical interconnections, may be in contact with the material of the mold encapsulation 30.

In general, the recess, the first part 20*a* of the metal clip 20, the semiconductor chip 18 and the substrate 12 may be stacked one above the other. The recess may be arranged above the first part 20*a* of the metal clip 20. The first part 20*a* of the metal clip 20 may be arranged on the semiconductor chip 18. The semiconductor chip 18 may be arranged on the substrate 12.

According to an embodiment of the invention, the first part 20*a* of the metal clip 20 is covered by a cover layer. The metal clip 20 may be divided from the recess by the cover layer, which may be (substantially) thinner than a thickness of the mold encapsulation 30 besides the recess. The cover layer may be at least 10 times thinner than the mold encapsulation 30 besides the recess. With the cover layer, areas of the metal clip 20 may be galvanically isolated from an interior of the recess. The cover layer may be made of the same material as the mold encapsulation 30 or of a different material.

The cover layer also may be made of a dielectric material. For example, the cover layer may be made of cold gas sprayed alumina, which may be applied on the metal clip 20, for example prior to module assembly.

The cover layer also may be painted and/or coated to increase the infrared emissions of the metal clip 20.

The cover layer also may be an insulating layer for galvanically isolating the metal clip 20 from a cooling fluid 60.

The cover layer may be based on at least two parts and/or at least two sublayers. For example, the cover layer may comprise an optical window combined with an electrical contact. The cover layer may be based on a two-layer material, for example such as $Al_2O_3$ covered with black paint.

According to an embodiment of the invention, the first part 20*a* of the metal clip 20 is at least partially exposed by the recess. Here, exposed may mean that the surface of the metal clip 20, which however may be covered by a thin layer such as a paint layer, may be a bottom wall of the recess. In such a way, an electrical connection to the metal clip 20 may be made through the recess. Exposed also may mean that an electric contact may be made with the metal clip 20 at the bottom of the recess.

The metal clip 20 may be bonded to a load current electrode and/or power electrode of the semiconductor chip 18 such as a source electrode or emitter electrode. The metal clip 20 also may be bonded to a control electrode of the semiconductor chip 18, such as a gate electrode. With an at least partially exposed metal clip 20, the recess allows an access to the respective power or control potential of the semiconductor chip 18.

According to an embodiment of the invention, the power semiconductor module 10 further comprises a circuit board 34 attached to the mold encapsulation 30 above the recess. The circuit board 34 may be a printed circuit board 34 and/or may be a gate driver board. The circuit board 34 may be attached to a side of the mold encapsulation 30, in which the one or more recesses are provided.

The circuit board 34 may carry sensors and/or contact elements, such as press-pins, which may be accommodated in the one or more recesses. One or more sensors and/or press-pins may be attached at the side of the circuit board 34 facing the mold encapsulation 30, for example to sense and/or extract chip 18 individual diagnostics.

According to an embodiment of the invention, a sealing ring 37 surrounding the recess 32 is provided between the circuit board 34 and the mold encapsulation 30. The sealing ring 37 may seal an interior of the recess from an environment of the power semiconductor module 10. The sealing ring 37 may seal the recess against dust and contamination. The sealing ring 37 may be made of the material of the mold encapsulation 30 or may be an additional component, which may be made of a different material. The sealing ring 37 may be a sealing rim.

According to an embodiment of the invention, a non-contact temperature sensor 36 facing into the recess towards the metal clip 20 is connected to the circuit board 34. A space may be provided between the non-contact temperature sensor 36 and the metal clip 20 and/or the cover layer on the metal clip 20. A non-contact temperature sensor 36 may be an IR temperature diode or other optical sensors for remote temperature sensing.

According to an embodiment of the invention, a contact temperature sensor 38 connected to the circuit board 34 is arranged in the recess in thermal contact with the metal clip 20. Such a temperature sensor 38, for example, a temperature dependent resistor 22, may be in direct contact with the metal clip 20 or the cover layer on the metal clip 20.

According to an embodiment of the invention, a magnetic field sensor connected to the circuit board 34 is arranged in the recess. The magnetic field sensor 40 may be a giant magneto-resistive sensor.

According to an embodiment of the invention, a press-pin 46 connected to the circuit board 34 is pressed onto the metal clip 20. Such a press-pin 46 may provide an auxiliary power electrode connection between the circuit board 34 and the power semiconductor electrode to which the metal clip 20 is connected. The press-pin 46 may be bonded to the metal clip 20, for example by an electrically conductive adhesive.

In general, a press-pin 46 may be a pin-shaped metal element protruding from the circuit board 34, which is substantially stiff to be pressed against the metal clip 20.

According to an embodiment of the invention, the power semiconductor module 10 further comprises a further, second recess running and/or approaching towards a part of the semiconductor chip 18 not covered by the metal clip 20. For example, the second recess 48 may at least partially expose a control electrode of the semiconductor chip 18. A further press-pin 52 connected to the circuit board 34 may be pressed to the semiconductor chip 18 in the further, second recess 48. Such a press-pin 52 may provide a control electrode connection between the circuit board 34, which may be a gate driver board, and the power semiconductor electrode to which the metal clip 20 is connected. The press-pin 52 may be bonded to the control electrode, for example by an electrically conductive adhesive.

According to an embodiment of the invention, the power semiconductor module 10 further comprises a further, for example third, recess 54 running and/or approaching towards a part of the metallization layer 14 of the substrate 12. Such a recess 54 may allow access specific areas of the metallization layer and/or selected potentials on the substrate 12.

A press-pin, which is connected to the circuit board 34, may be pressed to the metallization layer 14 in the further recess. The press-pin may be bonded to the metallization layer 14, for example by an electrically conductive adhesive.

According to an embodiment of the invention, a capacitor 58 mounted to the circuit board 34 opposite to the recess is connected to the press-pin. The recess towards the metallization layer 14, or two such recesses, may be used for connecting a decoupling capacitor 58 and/or other filter components (for example passives and non-linear devices such as diodes), which may be mounted on the circuit board 34, to the metallization layer 14. The capacitor 58 and/or the other filter components may be arranged in close proximity to the one or more press-pins and/or to the recess. This may result in decreased oscillations and switching losses.

According to an embodiment of the invention, a cooling fluid 60 is guided through the recess 32. The recess 32 may be in fluid exchange with a cooling guide and/or cooling channel of the power semiconductor module 10. For example, the recess 32 may be cooling fluid tight covered with a covering member and the cooling fluid 60 may be guided along the recess. The one or more recesses may be used to guide a coolant fluid along a topside of the one or more semiconductor chips 18.

It also may be that a bottom side of the power semiconductor module 10 is cooled, allowing for double-side cooling. A baseplate 26 and/or cooling plate, for example with cooling channels 28, may be attached to the substrate 12 opposite to the one or more semiconductor chips 18. This design may enable an improved chip 18-level power density by double-side cooling.

According to an embodiment of the invention, a nozzle 64 for cooling fluid 60 is directed inside the recess for jet impingement cooling. The cooling guide and/or cooling channel inside the recess may be formed as a nozzle to form a jet of cooling fluid 60, which is directed against the metal clip 20. This may even improve the cooling of the semiconductor chip 18 below the metal clip 20.

As disclosed herein, such a design may enable a non-invasive, low-cost and high-sensitivity diagnostics with the option to inspect each chip of a multichip power semiconductor module 10. The decision for implementation of diagnostics may be moved to the design of a respective gate driver board including sensors and/or press-pin contacts. For example, optical and physical-contact sensing may be enabled without the need of adding auxiliary terminals to the power semiconductor module 10.

With the recesses in the module 10, a quality control and end-of-line testing, such as electrical screening of each semiconductor chip 18, is possible. A calibration of chip 18-individual and chip 18-group parameters prior to field operation is possible. Online diagnostics in operation may be performed per chip 18, per chip 18 group, per phase-leg module and/or per similar module in the fleet. Also, health analysis during service intervals is possible.

Further applications may be lifetime prognostics, preventive maintenance, lifetime extension, fault tolerance and preventive actions for configuration with chip 18-individual gate control. For example, a reduced load may be applied to aged chip 18 via a respective control, defect chip 18 may be fused out, surge current may be redistributed to parallel devices, etc.

A further discussion with reference to particular figures will now be provided.

FIG. 1 shows a power semiconductor module 10. The power semiconductor module 10 comprises a substrate 12, for example a DBC (direct bonded copper) substrate, which has two metallization layers 14, 16 on each side. The metallization layer 14 is structured into areas 14*a*, 14*b*, 14*c*, 14*d*, and semiconductor chips 18 are bonded with a first power electrode to some of the areas 14*a*, 14*b*. The opposite side of each of the semiconductor chips 18 with a second power electrode is bonded to a metal clip 20, which is bonded to a further area 14*b*, 14*c* of the metallization layer 14.

The metal clip 20 comprises a first part 20*a* bonded to the power electrode, a middle part 20*b* and a second part 20*c*, which is bonded to the metallization layer 14. The first part 20*a* and the second part 20*c* may be flat members, while the middle part 20*b* may be bent. The metal clip 20 also may interconnect several semiconductor chips 18 and/or may be provided by a leadframe. Bonding of the metal clip 20 to the semiconductor chip 18 and/or the metallization layer 14 may be realized by sintering, soldering or laser-bonding.

It also may be that two areas 14*c*, 14*d* of the metallization layer 14 are connected by other electronic components, such as a resistor 22. Also terminals 24 may be connected to one or more of the areas 14*d*.

A baseplate 26, for example with cooling channels 28, may be attached to the substrate 12 and in particular the metallization layer 16.

All the components 12, 18, 20, 22, 24 mentioned so far may be enclosed by a mold encapsulation 30, which may encapsulate these components, such that only the baseplate 26, a part of the terminal(s) 24 and parts of the first parts 20*a* of the metal clips 20 are not encapsulated in the mold material. The mold encapsulation 30 may be made by transfer molding.

The mold encapsulation 30 has a recess 32 for each semiconductor chip 18 and/or metal clip 20, which recess protrudes from a side surface of the mold encapsulation 30 towards the respective semiconductor chip 18 and/or metal clip 20. The bottom of the recess 32 may be designed that such that the first part 20*a* of the metal clip 20 is at least partially exposed to an outside of the mold encapsulation 30. The other parts 20*b*, 20*c* of the metal clip 20 may be enclosed by the mold material. Also the semiconductor chip 18 may be completely enclosed by the mold material and the metal clip 20.

With the one or more recesses 32, a semiconductor chip side is accessible and an opening and/or channel to a power electrode, such as a source or emitter electrode of the semiconductor chip, is provided.

The power semiconductor module furthermore may comprise a circuit board 34, which is attached to the mold encapsulation 30 above the one or more recesses 32. The circuit board 34 may be a printed circuit board and/or may be a gate driver board. The baseplate 26 the substrate 12 and the circuit board 34 may be aligned substantially parallel to each other.

Components connected to the circuit board may be lowered into the recesses and/or may be used for sensing physical properties, such as temperature, current and voltage potential, of the metal clip 20 and/or the semiconductor chip 18 below.

For example, one or more recesses 32 may be used for optical temperature sensing, for example, by placing a non-contact temperature sensor 36, such as an IR diode or another sensor type into the recesses 32. The non-contact temperature sensor 36 may be bonded to the circuit board 34, where also the sensor wiring and signal analysis for the sensor 36 may be provided.

FIG. 1 also shows that one or more recesses 32 may be sealed with a sealing ring 37, which may be located between the mold encapsulation 30 and the circuit board 34. The sealing ring 37 may be an O-ring or mold material sealing lip. The sealing ring 37 may be used to keep the recess 32 free of dust and contamination.

It also may be that a black paint coating is applied to the exposed parts of the metal clip 20 to generate a defined and maximized surface emissivity for infrared sensing.

The following FIGS. 2 to 6 show embodiments of the semiconductor module 10 of FIG. 1, which show further possible usages of the recesses 32 and further embodiments of additional recesses.

Figure 2:
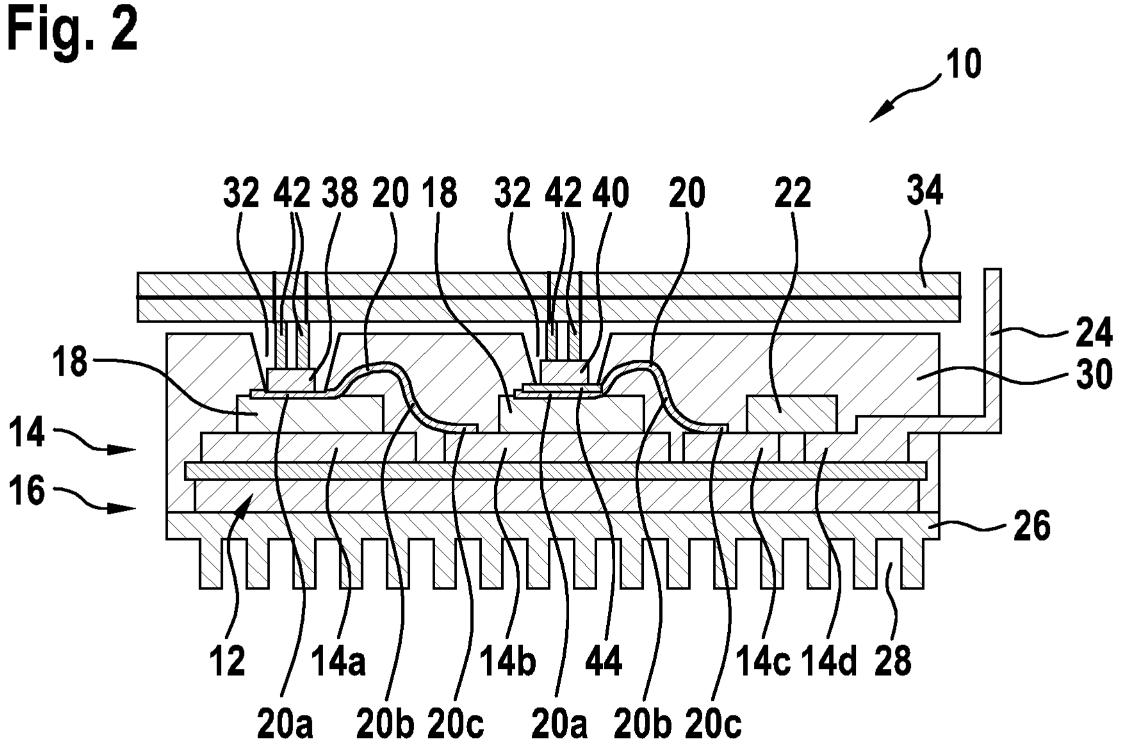
FIG. 2 schematically shows a cross-section through a power semiconductor module according to a further embodiment of the invention.

FIG. 2 shows that a contact temperature sensor 38 and/or a magnetic field sensor 40 may be arranged in the recess 32. A contact sensor 38, 40 may be connected to pins 42 of the circuit board 34, which press the sensor 38, 40 against the bottom of the recess 32 and/or the metal clip 20.

The magnetic field sensor 40 may be giant magneto-resistive sensors. For the case that the sensor requires galvanic insulation, a dielectric layer 44 may be provided between sensor 40 and the metal clip 20. Various materials may be used, such as cold gas sprayed (CGS) $Al_2O_3$, which may be pre-applied to the metal clip 20. This material may be applied at low cost and/or also may provide high thermal conductivity.

Figure 3:
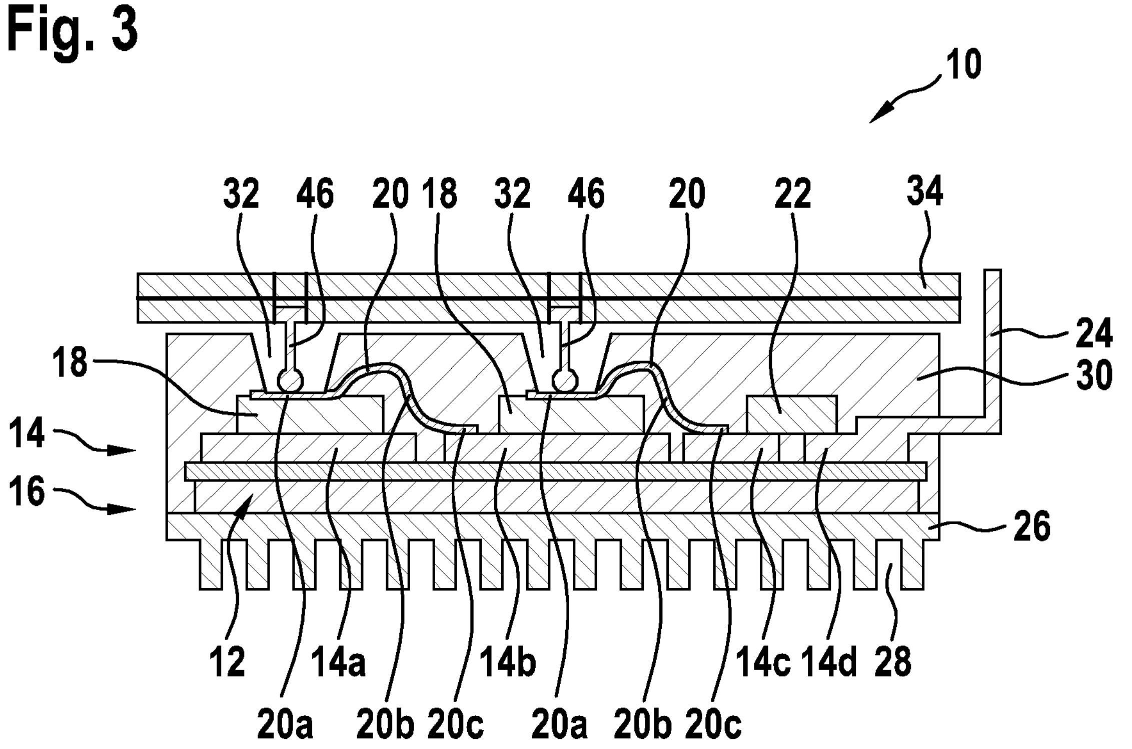
FIG. 3 schematically shows a cross-section through a power semiconductor module according to a further embodiment of the invention.

FIG. 3 shows that press-pins 46 protruding from the circuit board 34 may be used to electrically contact the metal clip 20. In such a way, an electrical connection between the circuit board 34 and a power electrode (such as the source or emitter electrode) of the semiconductor chip 18 may be generated.

The press-pins 46 may be integrated into the circuit board and may be pressed with a spring force against the metal clips 20. A layer of Au plating may be provided on the clip 20 to guarantee a low-ohmic and stable contact resistance. The topside press-pin contacts on the source or emitter electrode of the chip 18 may be used to extract chip-individual voltage transients that may be otherwise hidden in the average voltage signal at the terminals.

Such connections also may be used for chip temperature-sensitive electrical parameter (TSEP) sensing.

To increase the contact reliability of the press-pins 46 it is a further option to bond the press-pins 46 to the metal clips 20 by adding a bond material, for example, by capping tips of the press-pins 46 by an electrically conductive adhesive.

Figure 4:
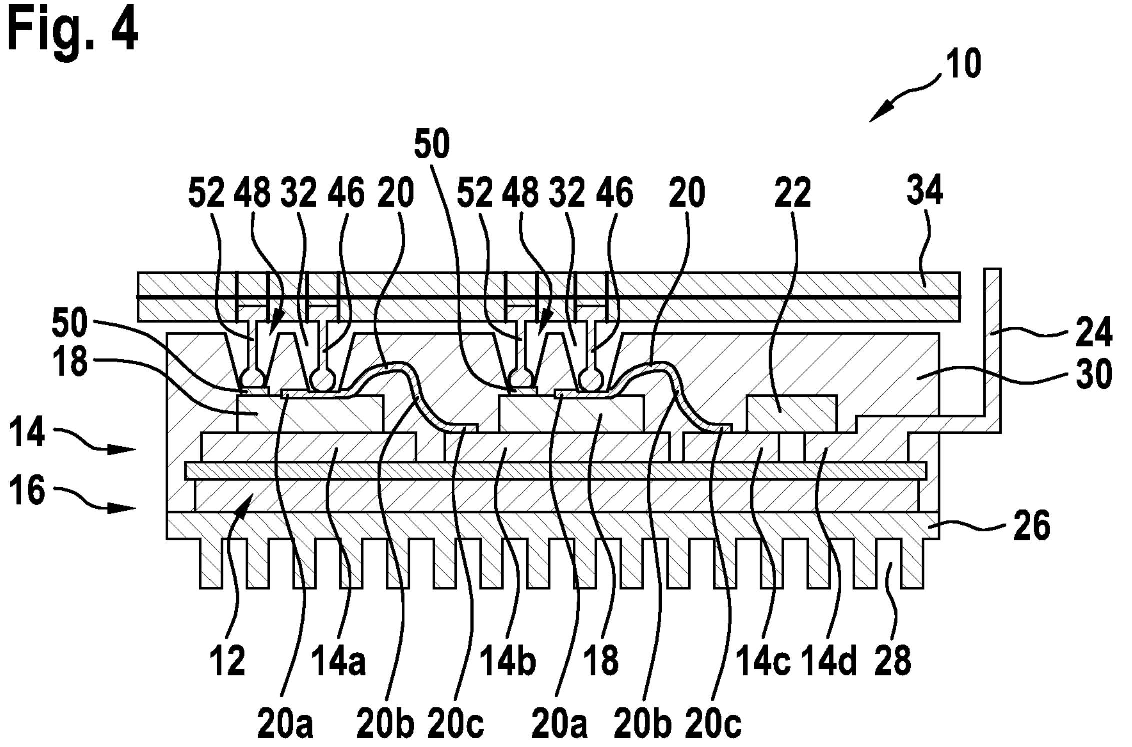
FIG. 4 schematically shows a cross-section through a power semiconductor module according to a further embodiment of the invention.

FIG. 4 shows that the mold encapsulation 30 has a second recess 48 for one or all of the chips 18, which runs towards a part of the semiconductor chip 18 not covered by the metal clip 20. The recess 48 may expose a control electrode (such as a gate electrode) of the semiconductor chip 18. A metal plate or strip 50 may be bonded to the control electrode, which also together with the mold encapsulation may complete enclose the parts of the semiconductor chip 18 surrounding the control electrode.

A second press-pin 52 of the circuit board 34 may be pressed through the recess 48 against the control electrode and/or the metal strip 50. In such a way, an electric connection between the circuit board 34 and the respective control electrode may be generated. The press-pin 52 may be attached to the circuit board 34 and/or bonded to the chip 18 like the press-pins 46.

With electrical connections to the source/emitter and the gate full TSEP sensing including the gate signals and/or chip-individual control for lifetime extension may be possible.

Figure 5:
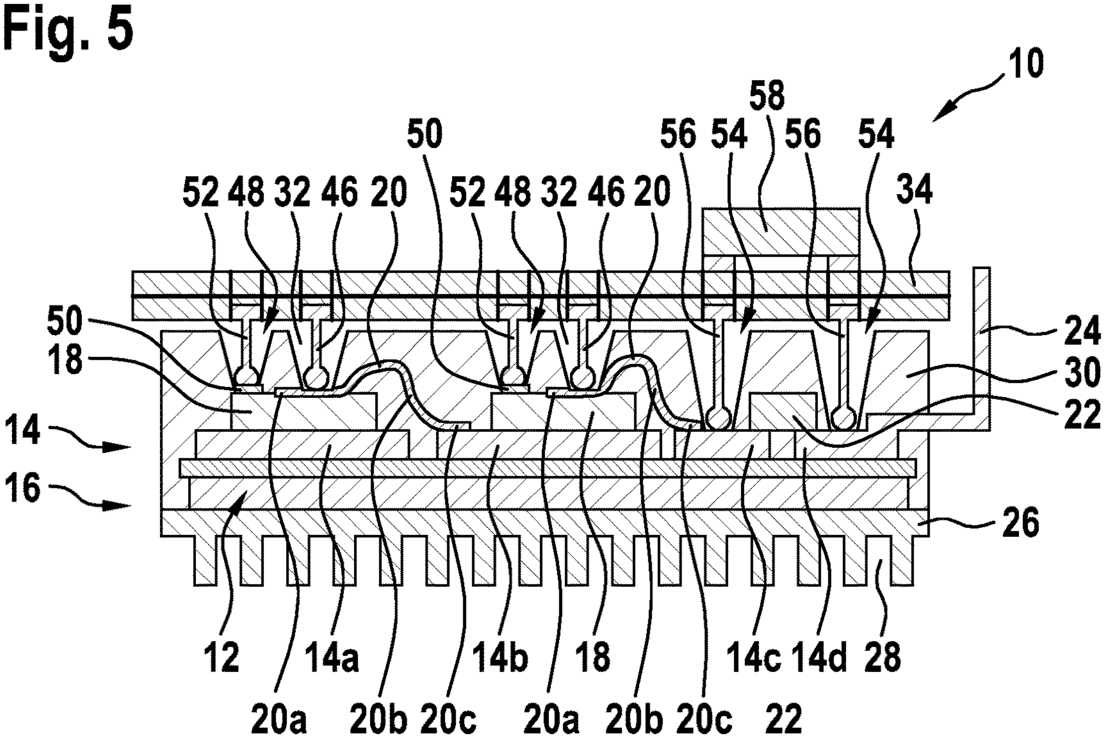
FIG. 5 schematically shows a cross-section through a power semiconductor module according to a further embodiment of the invention.

FIG. 5 shows further recesses 54 in the mold encapsulation 30, each of which runs towards an area 14*c*, 14*d* of the metallization layer 14. A press-pin 56 of the circuit board 34 may be pressed through each recess 54 against the area 14*c*, 14*d* exposed by the recess 54. The press-pins 56 may be attached to the circuit board 34 and/or bonded to the metallization layer 14 like the press-pins 46.

The press-pins 56 may be used to read-out an on-board sensor, such as a current shunt, a humidity sensor, etc., which may be enclosed in the mold encapsulation 30. The corresponding signals may be processed by the circuit board 34. The press-pins 56 also may be used to contact filter components, such as a decoupling capacitor 58. The filter components may be provided in close proximity to the recess on the circuit board 34. A decoupling capacitor 58 between DC+ and DC− potential areas 14*c*, 14*d* of the substrate 12 may be very useful in limiting oscillations and decreasing switching losses.

Figure 6:
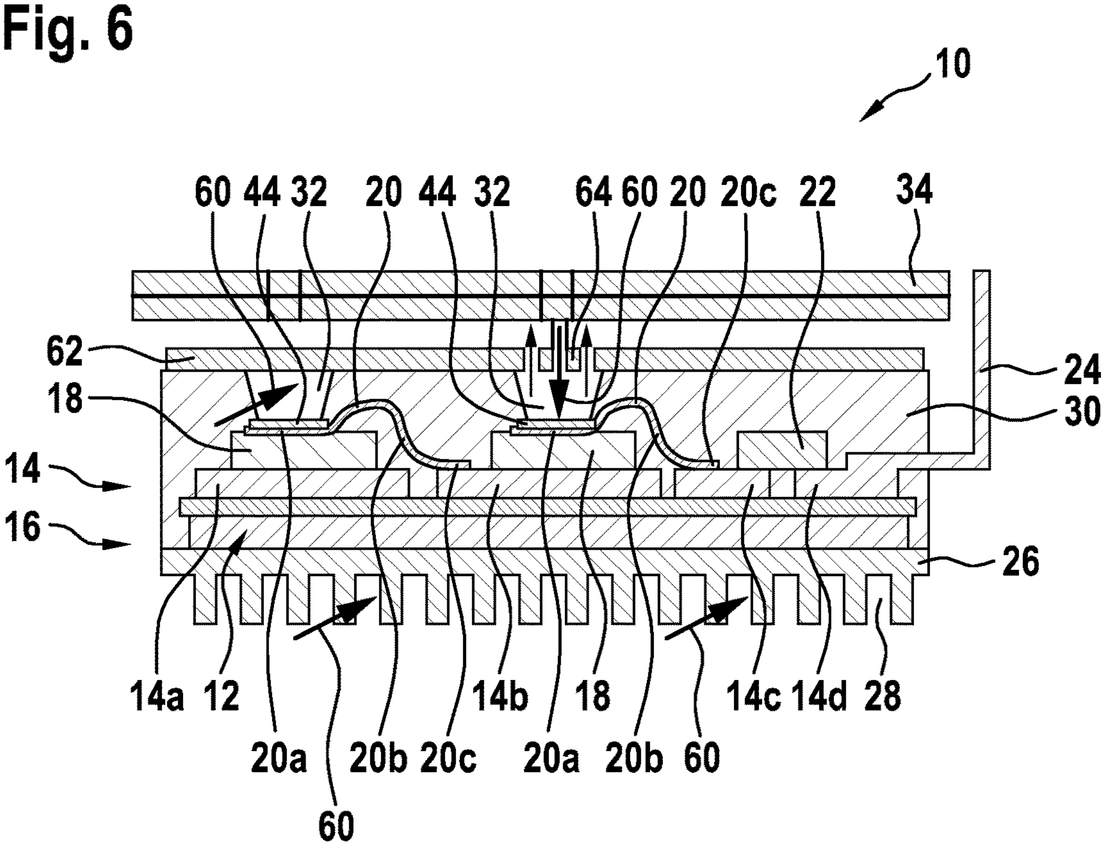
FIG. 6 schematically shows a cross-section through a power semiconductor module according to a further embodiment of the invention.

FIG. 6 shows that recesses 32 also may be used for cooling a topside of the semiconductor chips 18. A bottom side cooling of the semiconductor chips 18 may be performed by the baseplate 26 and/or via the substrate 12. In such a way, double-side cooling is possible.

A cooling fluid 60, such as water, water glycol mixtures or an insulating two-phase cooling fluid, may be guided through the recess 32. The same cooling fluid may be guided through cooling channels 28 of the baseplate 26. The cooling fluid 60 may be actively pumped through the recess 32 and/or the channels 28.

A recess 32 used for cooling may by partially covered by a cover plate 62 for generating a cooling channel. The cover plate 62 may be attached to an outer surface of the mold encapsulation 30. The cover plate 62 may be an Al sheet adhesively bonded to the mold encapsulation 30.

When non-dielectric cooling fluids 60, such as water and/or water glycol mixtures are used, the part 20*a* of the metal clip 20 exposed by the recess may be covered by a cover layer 44, which insulates the metal clip 20 and the chip 18 from the cooling fluid 60.

The cooling may be based on a parallel cooling fluid flow, for example along the metal clip 20.

The cooling may be based on a perpendicular flow, for example by focusing a high-speed fluid jet on the metal clip 20. A nozzle and/or flow-guide 64, which may be provided by the cover plate 62, may guide the cooling fluid 60 in a jet and/or beam against the metal clip 20.

It has to be noted that the embodiments described above can be combined with each other. For example, press-pins may be combined with non-contact and/or contact sensors. Also the described cooling possibilities may be combined with press-pins and/or sensors.

While the invention has been illustrated and described in detail in the drawings and foregoing description, such illustration and description are to be considered illustrative or exemplary and not restrictive, the invention is not limited to the disclosed embodiments. Other variations to the disclosed embodiments can be understood and effected by those skilled in the art and practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A power semiconductor module, comprising:

a substrate with a metallization layer that is structured;

a semiconductor chip having a first side bonded to the metallization layer;

a metal clip, which is a strip of metal, having a first planar part, a middle part, and a second planar part, the first planar part being bonded to a second side of the semiconductor chip opposite to the first side, the second planar part being bonded to the metallization layer, and the middle part being between the first planar part and the second planar part;

a mold encapsulation at least partially encapsulating the substrate, partially encapsulating the second planar part of the metal clip and completely encapsulating the middle part of the metal clip, the mold encapsulation having a recess exposing a part of the first planar part of the metal clip on the semiconductor chip, wherein the semiconductor chip is enclosed by at least the mold encapsulation, the substrate, and the metal clip;

a circuit board attached to the mold encapsulation above the recess; and a sensor coupled to the circuit board and accommodated in the recess.

2. The power semiconductor module of claim 1, further comprising a sealing ring surrounding the recess between the circuit board and the mold encapsulation.

3. The power semiconductor module of claim 1, wherein the sensor comprises a non-contact temperature sensor facing into the recess towards the metal clip and connected to the circuit board.

4. The power semiconductor module of claim 1, wherein the sensor comprises a contact temperature sensor connected to the circuit board and arranged in the recess in thermal contact with the metal clip.

5. The power semiconductor module of claim 1, wherein the sensor comprises a magnetic field sensor arranged in the recess and connected to the circuit board.

6. The power semiconductor module of claim 1, further comprising a press-pin connected to the circuit board in the recess and pressed onto the metal clip.

7. The power semiconductor module of claim 1, further comprising a cover layer, wherein the first planar part of the metal clip is covered by the cover layer.

8. The power semiconductor module of claim 7, wherein the cover layer is made of a different material than the mold encapsulation.

9. The power semiconductor module of claim 1, further comprising:

a further recess towards a part of the semiconductor chip not covered by the metal clip; and a press-pin located in the further recess, connected to the circuit board, and pressed to the semiconductor chip.

10. The power semiconductor module of claim 1, further comprising:

a further recess towards a part of the metallization layer of the substrate; and a press-pin in the further recess, connected to the circuit board, and pressed to the metallization layer.

11. The power semiconductor module of claim 10, further comprising a capacitor mounted to the circuit board opposite to the further recess, the capacitor being electrically connected to the press-pin.

12. The power semiconductor module of claim 1, further comprising a cooling fluid guided through the recess.

13. The power semiconductor module of claim 1, further comprising a nozzle for directing a cooling fluid inside the recess.

14. A power semiconductor module, comprising:

a substrate with a metallization layer that is structured;

a semiconductor chip having a first side bonded to the metallization layer;

a metal clip, which is a strip of metal, having a first planar part, a middle part, and a second planar part, the first planar part being bonded to a second side of the semiconductor chip opposite to the first side, the second planar part being bonded to the metallization layer, and the middle part being between the first planar part and the second planar part;

a mold encapsulation at least partially encapsulating the substrate, partially encapsulating the second planar part of the metal clip, and completely encapsulating the middle part of the metal clip, wherein the semiconductor chip is enclosed by at least the mold encapsulation, the substrate, and the metal clip, and wherein the mold encapsulation comprises a first recess exposing a part of the first planar part of the metal clip on the second side of the semiconductor chip, a second recess exposing a part of the second side of the semiconductor chip not covered by the first planar part of the metal clip, and a third recess exposing a part of the metallization layer of the substrate not covered by the second planar part of the metal clip;

a circuit board attached to the mold encapsulation above the first recess;

a sensor coupled to the circuit board and accommodated in the first recess;

a first press-pin located in the second recess, connected to the circuit board, and pressed to the semiconductor chip; and a second press-pin in the third recess, connected to the circuit board, and pressed to the metallization layer.

15. The power semiconductor module of claim 14, further comprising a capacitor mounted to the circuit board opposite to the third recess, the capacitor being electrically connected to the second press-pin.

16. The power semiconductor module of claim 14, further comprising a sealing ring surrounding the first recess between the circuit board and the mold encapsulation.

17. A power semiconductor module, comprising:

a substrate with a metallization layer that is structured;

a semiconductor chip having a first side bonded to the metallization layer;

a metal clip, which is a strip of metal, having a first planar part bonded to a second side of the semiconductor chip opposite to the first side, the metal clip also having a second planar part bonded to the metallization layer;

a mold encapsulation at least partially enclosing the substrate and the metal clip, the mold encapsulation having a recess approaching towards the first planar part of the metal clip, wherein the semiconductor chip is enclosed by at least the mold encapsulation, the substrate, and the metal clip and wherein the first planar part of the metal clip is at least partially exposed by the recess;

a circuit board attached to the mold encapsulation above the recess;

a sensor coupled to the circuit board and accommodated in the recess;

a capacitor mounted to the circuit board opposite to the recess; and a cooling fluid guided through the recess.

18. The power semiconductor module of claim 17, further comprising a sealing ring surrounding the recess between the circuit board and the mold encapsulation.

19. The power semiconductor module of claim 17, further comprising a press-pin connected to the circuit board and pressed onto the metal clip.

20. The power semiconductor module of claim 17, further comprising a nozzle for the cooling fluid, the nozzle being directed inside the recess and configured for jet impingement cooling.

* * * * *